United States Patent
Mehta et al.

(10) Patent No.: US 11,618,553 B2
(45) Date of Patent: Apr. 4, 2023

(54) METHOD AND PROCESS OF CREATING QUALIFIABLE PARAMETER DATA ITEM (PDI) TO DEFINE THE FUNCTION OF A POWER SYSTEM CONTROLLER

(71) Applicant: GE AVIATION SYSTEMS LIMITED, Cheltenham (GB)

(72) Inventors: Keval Mehta, Cheltenham (GB); Mark Shere, Stroud (GB); Neil Edward Evans, Cheltenham (GB); Steven Michael Coates, Tewkesbury (GB); Daniel John Capper, Cheltenham (GB)

(73) Assignee: GE Aviation Systems Limited, Cheltenham (GB)

( * ) Notice: Subject to any disclaimer, the term of this patent is extended or adjusted under 35 U.S.C. 154(b) by 183 days.

(21) Appl. No.: 16/951,832

(22) Filed: Nov. 18, 2020

(65) Prior Publication Data

US 2021/0147069 A1     May 20, 2021

Related U.S. Application Data

(60) Provisional application No. 62/937,506, filed on Nov. 19, 2019.

(51) Int. Cl.
*G06F 11/30* (2006.01)
*B64C 19/00* (2006.01)
(Continued)

(52) U.S. Cl.
CPC .............. *B64C 19/00* (2013.01); *B64D 43/00* (2013.01); *G06F 9/3017* (2013.01); *G06F 9/463* (2013.01);
(Continued)

(58) Field of Classification Search
CPC ....... B64C 19/00; B64D 43/00; G06F 9/3017; G06F 9/463; G06F 9/44; G06F 30/20; G06F 30/30; G06F 11/261; G06F 8/35
See application file for complete search history.

(56) References Cited

U.S. PATENT DOCUMENTS

| 6,556,950 B1 * | 4/2003 | Schwenke .............. G05B 17/02 700/86 |
| 8,948,938 B2 | 2/2015 | Chazottes et al. |

(Continued)

FOREIGN PATENT DOCUMENTS

| CN | 108089976 A | 5/2018 |
| EP | 3147885 A1 | 3/2017 |

(Continued)

OTHER PUBLICATIONS

Andrei Vladimirovich et al., The Analysis of Opportunities of Construction and Use of Avionic Systems Based on Cost-Modules, Jan. 2016, [Retrieved on Oct. 30, 2022]. Retrieved from the internet: <URL: http://www.arpnjournals.org/jeas/research_papers/rp_2016/jeas_0116_3301.pdf> 15 Pages (78-92) (Year: 2016).*

*Primary Examiner* — Anibal Rivera
(74) *Attorney, Agent, or Firm* — McGarry Bair PC

(57) ABSTRACT

A method and system of designing control logic for an avionics system, the method and system including receiving a function requirement defining a desired control logic for the desired control system, designing, by a user in a user interface (UI) of a toolset, the desired control logic comprising an arrangement of predefined library blocks to enable the functional requirement in the desired control system, and generating, by the toolset, a data file representative of the desired control logic to enable the functional requirement during run-time operation in the avionics system.

18 Claims, 9 Drawing Sheets

(51) Int. Cl.
    *B64D 43/00*     (2006.01)
    *G06F 9/30*     (2018.01)
    *G06F 9/46*     (2006.01)
    *G06F 11/26*     (2006.01)
    *G06F 30/20*     (2020.01)
    *G06F 8/35*     (2018.01)
    *G06F 30/30*     (2020.01)

(52) U.S. Cl.
    CPC .............. *G06F 8/35* (2013.01); *G06F 11/261* (2013.01); *G06F 30/20* (2020.01); *G06F 30/30* (2020.01)

(56) References Cited

U.S. PATENT DOCUMENTS

| | | | |
|---|---|---|---|
| 2003/0220987 | A1 | 11/2003 | Pearson |
| 2004/0073404 | A1* | 4/2004 | Brooks ................ G05B 19/409 |
| | | | 702/183 |
| 2013/0282207 | A1 | 10/2013 | Chazottes et al. |
| 2015/0347127 | A1* | 12/2015 | Leibham ................... G06F 8/10 |
| | | | 717/126 |
| 2016/0188765 | A1 | 6/2016 | Vossler et al. |
| 2017/0017222 | A1 | 1/2017 | Keitel |
| 2017/0063995 | A1* | 3/2017 | Gunn ...................... H04L 67/12 |
| 2020/0089476 | A1* | 3/2020 | Verhaeghe ................ G06F 8/38 |

FOREIGN PATENT DOCUMENTS

| | | |
|---|---|---|
| FR | 2989795 A1 | 10/2013 |
| FR | 3045879 A1 | 6/2017 |
| WO | 20030100608 A2 | 12/2003 |
| WO | 20050060413 A2 | 7/2005 |

\* cited by examiner

METHOD AND PROCESS OF CREATING QUALIFIABLE PARAMETER DATA ITEM (PDI) TO DEFINE THE FUNCTION OF A POWER SYSTEM CONTROLLER

CROSS REFERENCE TO RELATED APPLICATION(S)

This application claims priority to and benefit of U.S. Provisional Patent Application No. 62/937,506, filed Nov. 19, 2019, which is incorporated herein in its entirety.

TECHNICAL FIELD

The disclosure relates to a method and apparatus for generating programmable instructions for operation of a power switch.

BACKGROUND

Systems and toolsets can allow developers to generate control systems using user interfaces (UIs) to arrange functional operations. In a regulated system, such as an avionics system, validation or verification of design control systems are qualified prior to being implemented within the regulated system.

BRIEF DESCRIPTION

In one aspect, the present disclosure relates to a system for designing control logic, including a set of pre-qualified library blocks defining available control logic operations for a desired control system, a user interface (UI) for designing desired control logic and utilizing at least a subset of the pre-qualified library blocks, and a parameter data item (PDI) file generated by the system, the PDI file defining a block sequence PDI having an ordered sequence arrangement to enable the desired control logic during run-time operation in the desired control system, the PDI file including the addressable arrangement of the subset of the pre-qualified library blocks.

In another aspect, the present disclosure relates to a toolset to design control logic for a power system controller in a regulated avionics system, including a set of pre-qualified library blocks defining available control logic operations for the power system controller, a user interface (UI) for designing a desired control logic and utilizing at least a subset of the pre-qualified library blocks, a parameter data item (PDI) file generated by the system, the PDI data file defining a block sequence PDI having an ordered sequence arrangement to enable the desired control logic during run-time operation in the power system controller, the PDI data file including the addressable arrangement of the subset of the pre-qualified library blocks, and a verification tool configured to quality qualify the PDI data file for qualified operation in the power system controller of the regulated avionics system.

In yet another aspect, the present disclosure relates to a method of designing control logic for an avionics system, the method including receiving a function requirement defining a desired control logic for the avionics system, designing, by a user in a user interface (UI) of a toolset, the desired control logic comprising an arrangement of pre-defined library blocks to enable the functional requirement in the avionics system, and generating, by the toolset, a parameter data item (PDI) file representative of the desired control logic, wherein the PDI data file includes a block sequence PDI defining an ordered sequence arrangement of operations to enable the functional requirement during run-time operation in the avionics system.

These and other features, aspects and advantages of the present disclosure will become better understood with reference to the following description and appended claims. The accompanying drawings, which are incorporated in and constitute a part of this specification, illustrate aspects of the disclosure and, together with the description, serve to explain the principles of the disclosure.

DETAILED DESCRIPTION

Figure 1:
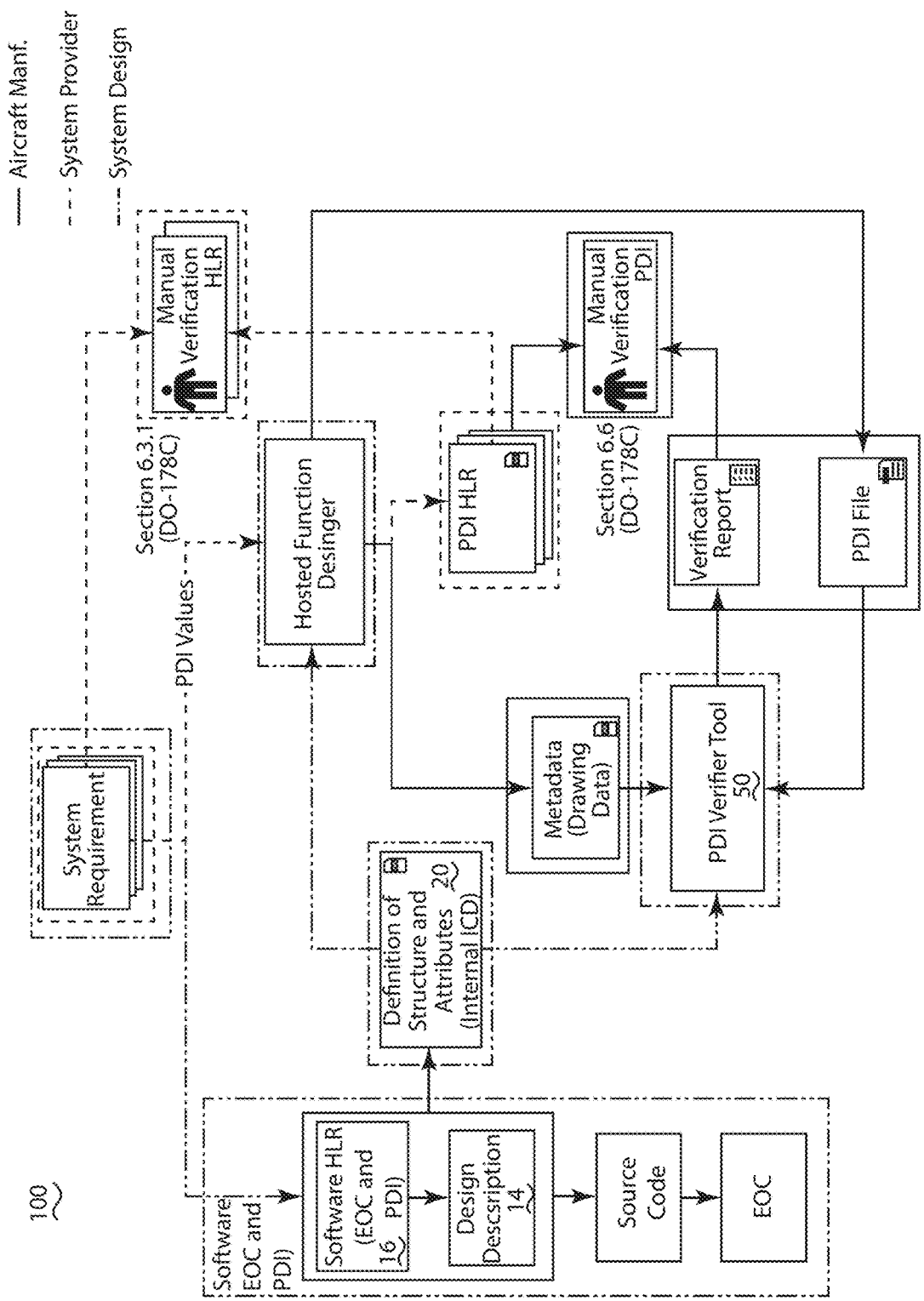
FIG. 1 illustrates an example schematic system view of the method and process described herein.

Aspects of the disclosure can be implemented in any environment, apparatus, or method for developing, generating, executing, or otherwise creating parameter data item (PDI) functional components, including but not limited to, the use of which can be included in aircraft systems, and regardless of the function performed by the PDI modules.

As used herein, the term "set" or a "set" of elements can be any number of elements, including only one. Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value.

As used herein, the term "upstream" refers to a direction that is opposite the fluid flow direction, and the term "downstream" refers to a direction that is in the same direction as the fluid flow. Additionally, while terms such as "voltage", "current", and "power" can be used herein, it will be evident to one skilled in the art that these terms can be interrelated when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus. Additionally, as used herein, "electrical connection" or "electrically coupled" can include a wired or wireless connection. The exemplary drawings are for purposes of illustration only and the dimensions, positions, order and relative sizes reflected in the drawings attached hereto can vary.

Additionally, as used herein, a "controller" or "controller module" can include a component configured or adapted to provide instruction, control, operation, or any form of communication for operable components to effect the operation thereof. A controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller (PD), a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module can also include a data storage component accessible by the processor, including memory, whether transient, volatile or non-transient, or non-volatile memory.

Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to effect a functional or operable outcome, as described herein. In another non-limiting example, a control module can include comparing a first value with a second value, and operating or controlling operations of additional components based on the satisfying of that comparison. For example, when a sensed, measured, or provided value is compared with another value, including a stored or predetermined value, the satisfaction of that comparison can result in actions, functions, or operations controllable by the controller module. As used, the term "satisfies" or "satisfaction" of the comparison is used herein to mean that the first value satisfies the second value, such as being equal to or less than the second value, or being within the value range of the second value. It will be understood that such a determination may easily be altered to be satisfied by a positive/negative comparison or a true/false comparison. Example comparisons can include comparing a sensed or measured value to a threshold value or threshold value range.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

Aspects of the disclosure can be implemented in any environment, apparatus, system, or method having a regulated, restricted, authorized, or otherwise limited "write-access" privileges to a memory or data store component. As used herein, "write-access" means availability or authorization to commit a change to a memory, the change being storing or overwriting data, values, commands, instructions, or any other data, element, or identifier to a memory location, regardless of the function performed by the data, element, or identifier, or regardless of the function or implementation of the environment, apparatus, system, or method. Collectively, "access" to data or "accessing" data can refer to either reading, viewing, or otherwise receiving data from a data store, "writing" data, as referenced above, or a combination thereof. As used herein, a "regulated" system is a system having restrictions on access, such as write-access to data or values of the system, whereby only approved or authorized entities, parties, functions, or the like, are enabled or otherwise allowed to access the regulated or restricted elements. In one non-limiting example, only a single authorized function can have write access to a specific data element.

Aviation certification regulations for software have quite different objectives for the development of flight software and airborne configuration data. The latter providing a much-reduced development lifecycle. By applying appropriate bounds to the allowable values of configuration data, the aim is to allow a single core software release to operate as required for any combination of the configuration data. The software operation will be deterministic, regardless of the values stored in the PDI. This does increase the cost of testing the core software that interprets the configuration data, however it provides the advantage of reconfiguring the system using the PDI, thus improving cost of re-use across multiple applications.

FIG. 1 overviews aspects of the disclosure, including but not limited to, aspects related to the design, generation, verification, and implementation of PDI modules. FIG. 1 further describes non-limiting responsibilities for various involved organizations or "process owners." While Simulink is described as one non-limiting example of toolbox or design software, many different functional toolbox, design, or other programming environments can be included.

Figure 2:
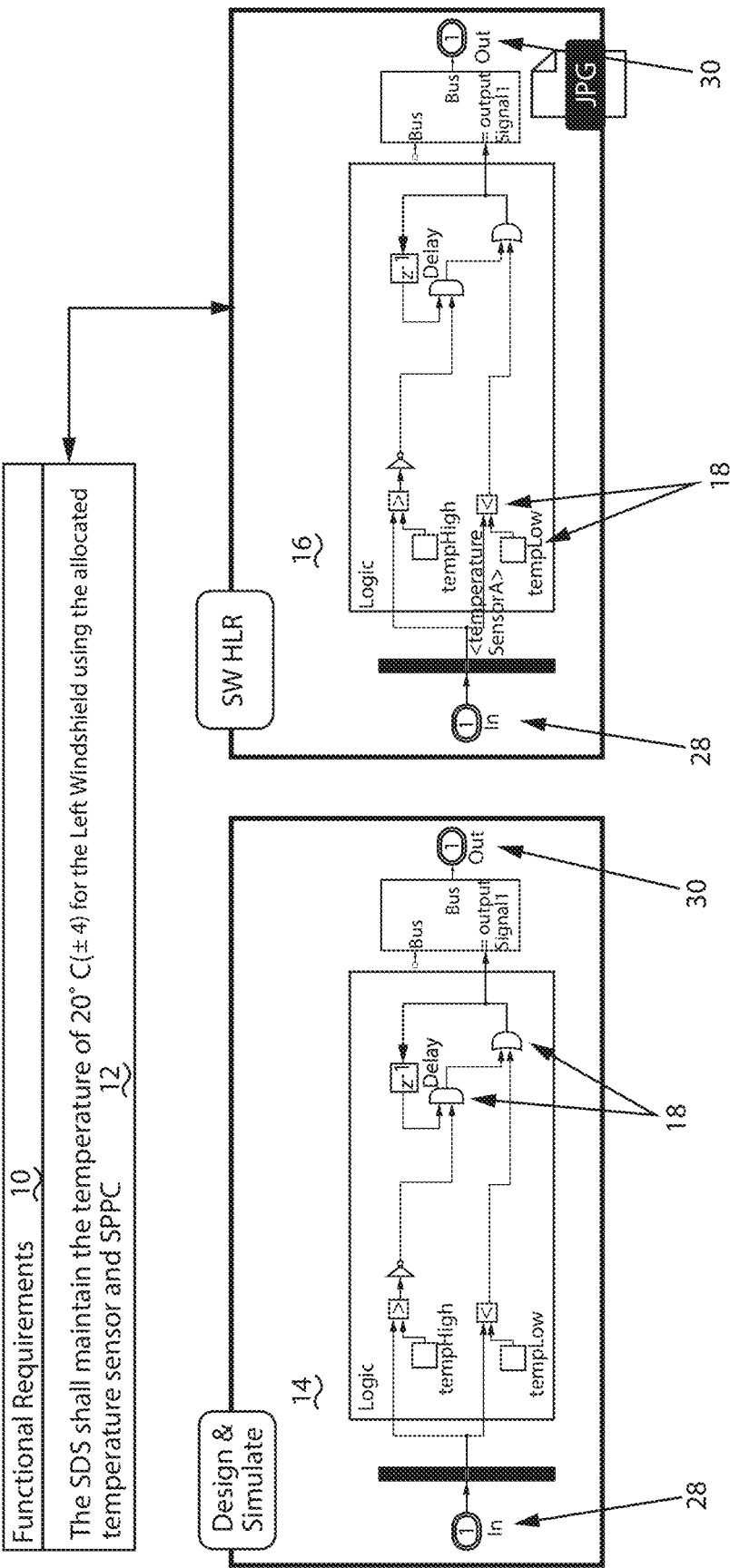
FIG. 2 illustrates an example schematic view of requirements for the system, in accordance with various aspects described herein.
Figure 9:
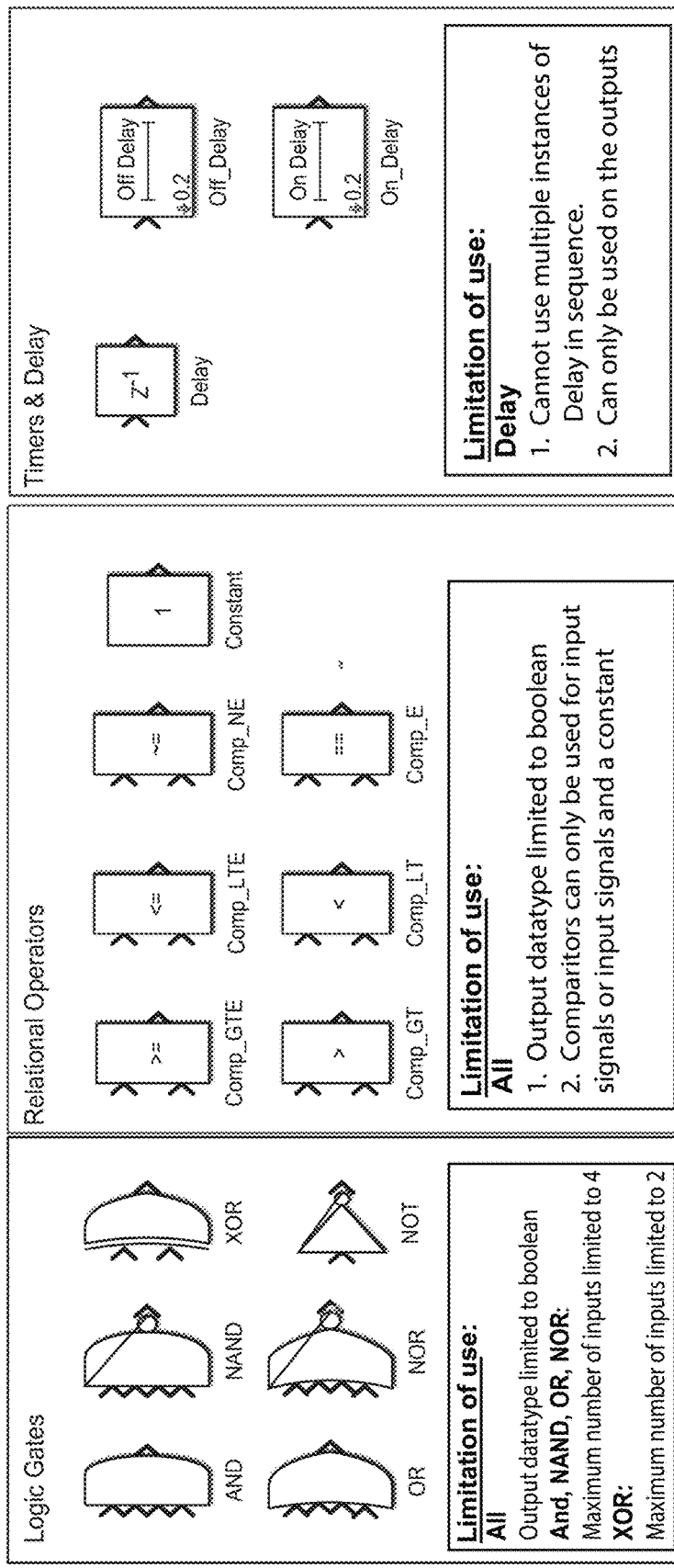
FIG. 9 illustrates a non-limiting example of logic gates that can be utilized in the method, process, and system described herein.

The aspects of FIG. 1 and FIG. 2 can include a toolset or system 100 for designing a control logic for execution or operation in a regulated control environment, such as in an aircraft system (not shown), based on utilizing a PDI module. As shown, a functional requirement 10 can define a task to be designed or included in a run-time system. An example description 12 of the functional requirement 10 is shown in FIG. 2, for understanding. The task can be represented in a designing and simulating environment 14 or in a software high level requirement design 16, or a combination thereof. The disclosure details the method of generating these PDI files or module from a simulation environment 14 (for example, Simulink) to enable or allow for a functional outcome or functional operation, based on a set of functional instructions or data. For understanding, "PDI files" can include PDI data and files, as understood by one skilled in the art, and with reference to (but not limitation to), Software Consideration in Airborne Systems and Equipment Certification document DO-178C. The simulation environment 14 would include a number of predetermined logic blocks or library blocks 18 that represent available library functions supported by the embedded platform (e.g. see FIG. 9; illustrating a non-limiting list of possible functions supported, and shown as logic blocks).

Each of the logic blocks 18 can represent an atomic operation in a controller module of the run-time system, and can be approximated or simulated by the system 14, 16. The system inputs 28 and outputs 30 can be defined by an Interface Control Document (ICD) 20 that is provided to this toolset or system 100. In one non-limiting example, the ICD 20 can be a predefined document or data file that defines operational characteristics of the design blocks. The ICD 20 provides a developer, designer, or user with the available input 28 and output signals 30. The user shall use the available signals and logic blocks 18 to define their required system functionality 10. FIG. 2 shows an example of one such simulated function 10, 12.

Figure 3:
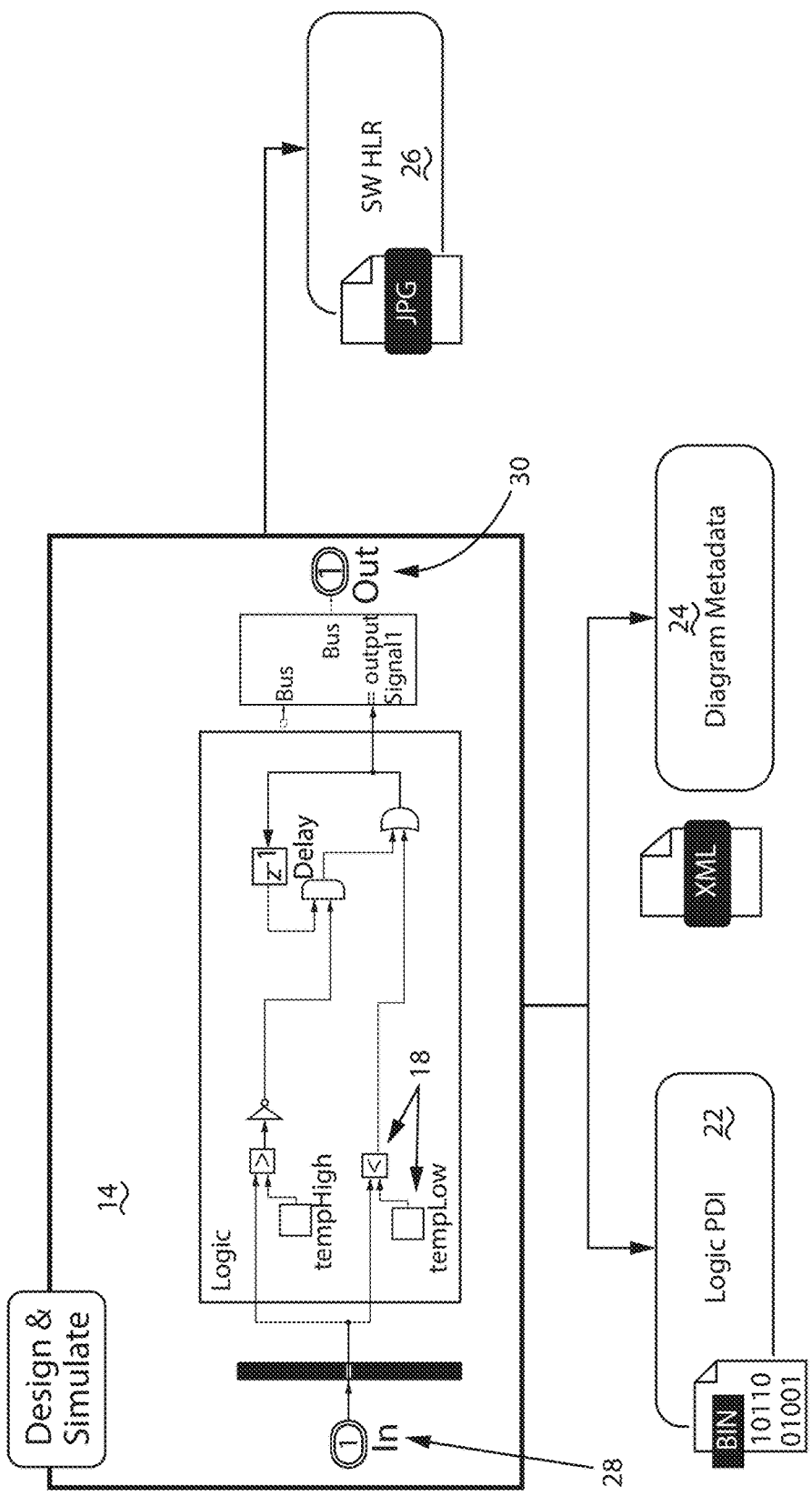
FIG. 3 illustrates an example schematic view of the control logic generation of the system, in accordance with various aspects described herein.

Simulink, or another simulation environment tool, can then be used to model and modify the operation of the logic, until the desired behavior is achieved. This is repeated for all the functional requirements 10 of the system 100. The toolset or system 100 would then provide a mechanism to generate a PDI file that implements the required functions 10. The generation of the PDI can be shown in FIG. 3. Only a design and simulate environment 14 is illustrated, for brevity, but aspects of the disclosure are equally applicable to either a design and simulate environment 14 or a software high level requirement design 16. The generation of the PDI creates a Logic PDI file 22, an XML diagram metadata file 24, a software high level requirements image 26 representing the simulated function, or a combination thereof.

Figure 4:
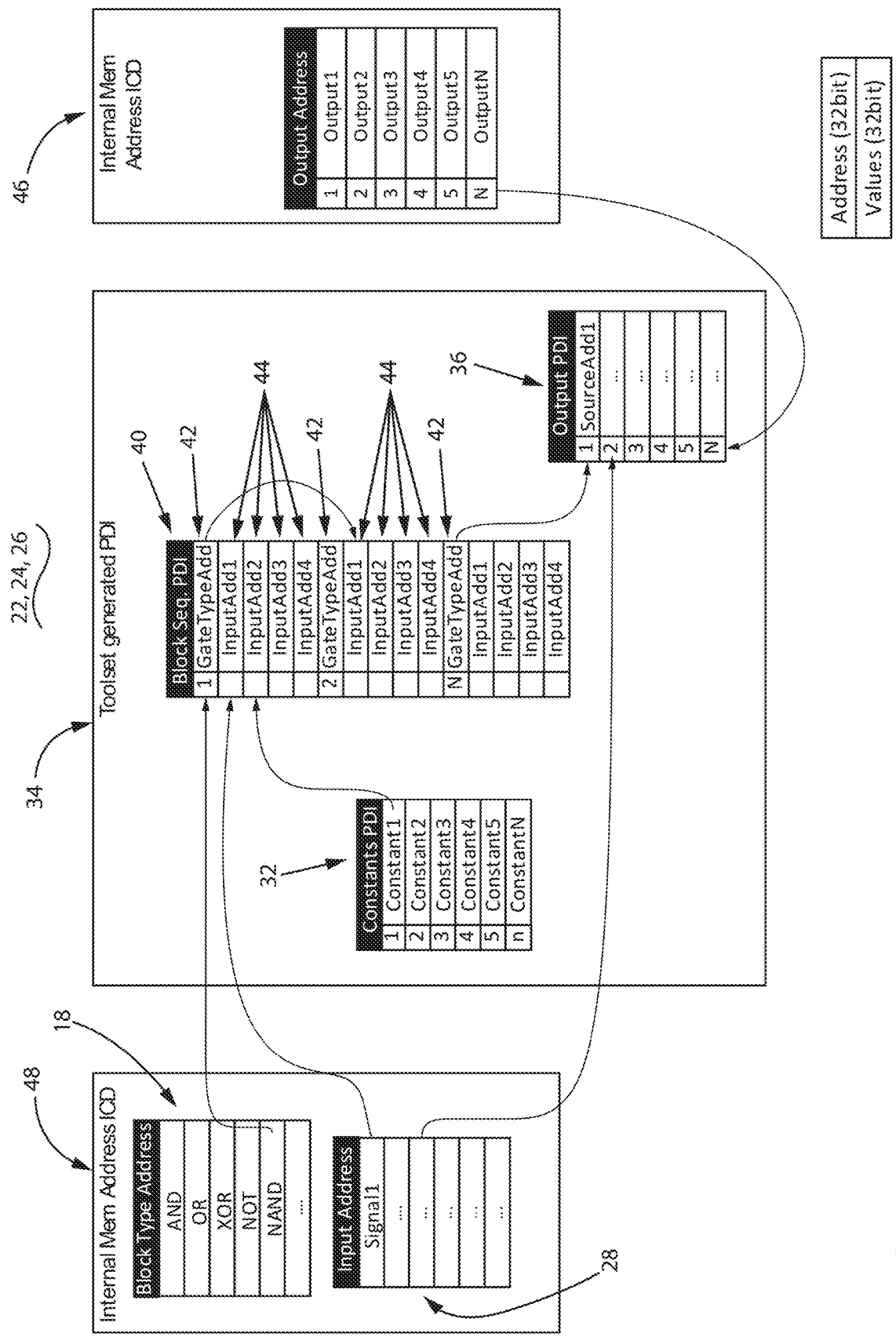
FIG. 4 illustrates an example schematic view of the generated parameter data item (PDI) of the system in accordance with various aspects described herein.

The following diagram shows the layout of the PDI and data held in these files. The internal ICD 20, included in either the Logic PDI 22 or the Diagram Metadata 24, provides the following information to the toolset:

1. Address values for block 18 types
2. Address values for input signal 28 buffers
3. Address values for output signal 30 buffers Using this information along with the logic blocks 18 defined by the user in the simulation environment 14, 16, the toolset produces three sets of PDIs, as shown in the example of FIG. 4: a constant PDI 32, a block sequence PDI 34, an output PDI 36, or a combination thereof.

The constant PDI 32 includes the values of internal constants defined by the user, such as predefined values or ranges. The toolset or system 100 considers any translation required from the simulation environment to make it compatible for the core software engine.

The block sequence PDI 34 contains the sequences 40 of the blocks defined by the user, such as the logic blocks or library blocks 18. The layout of the PDI includes an address pointer 42 to the type of the gate to help the engine determine the operation to be performed. Following the block type each instance of the blocks 18 would include a list of input addresses 44. The inputs 44 of each block could include a combination of input signal buffers 38 or constants 32 defined in the constants PDI 32 or output PDI 36 from any preceding blocks. The number of inputs 44 to each block would be predefined based on the type of the block. The core software engine would execute the blocks based on the sequence 40 of their appearance in the block sequence PDI 34. As shown, the blocks 18 and the input signal buffers 28 are grouped together 48 for illustration, but those skilled in the art will understand that the blocks 18 and buffers 28 may not be commonly arranged in the system 100.

A non-limiting example of the sequence of this PDI is defined by the toolset based on the following rules, or a subset thereof:

1. All input signals 28, 44 are processed prior to the execution of user defined blocks 18.
2. No block 18 shall be executed or processed prior to all of its inputs 44 being executed.
3. In case of use of a delay block 18, the toolset or system 100 ignores rule 2, to provide the previous value of the source (please note delay blocks are limited to a unit delay).

The toolset or system 100 can provide a PDI module compatible with the above rules by means of a recursive algorithm that interrogates the simulation model to understand the nature and type of the connections between various blocks 18. The software engine designed for the run-time controller, can run at a fixed schedule executing inputs 28, 44, function blocks 18, and outputs 36 in that sequence. As shown, the outputs 36 may further be stored, communicated, or transmitted to a further memory 46 of the system 100, for example, for preservation, further analysis, determinations, comparisons, or the like. The engine shall have a limit or budget on the number of blocks 18 allowed to be executed based on the platform, and the toolset or system 100 will take that into account to warn the user in case the user exceeds the budget.

Figure 5:
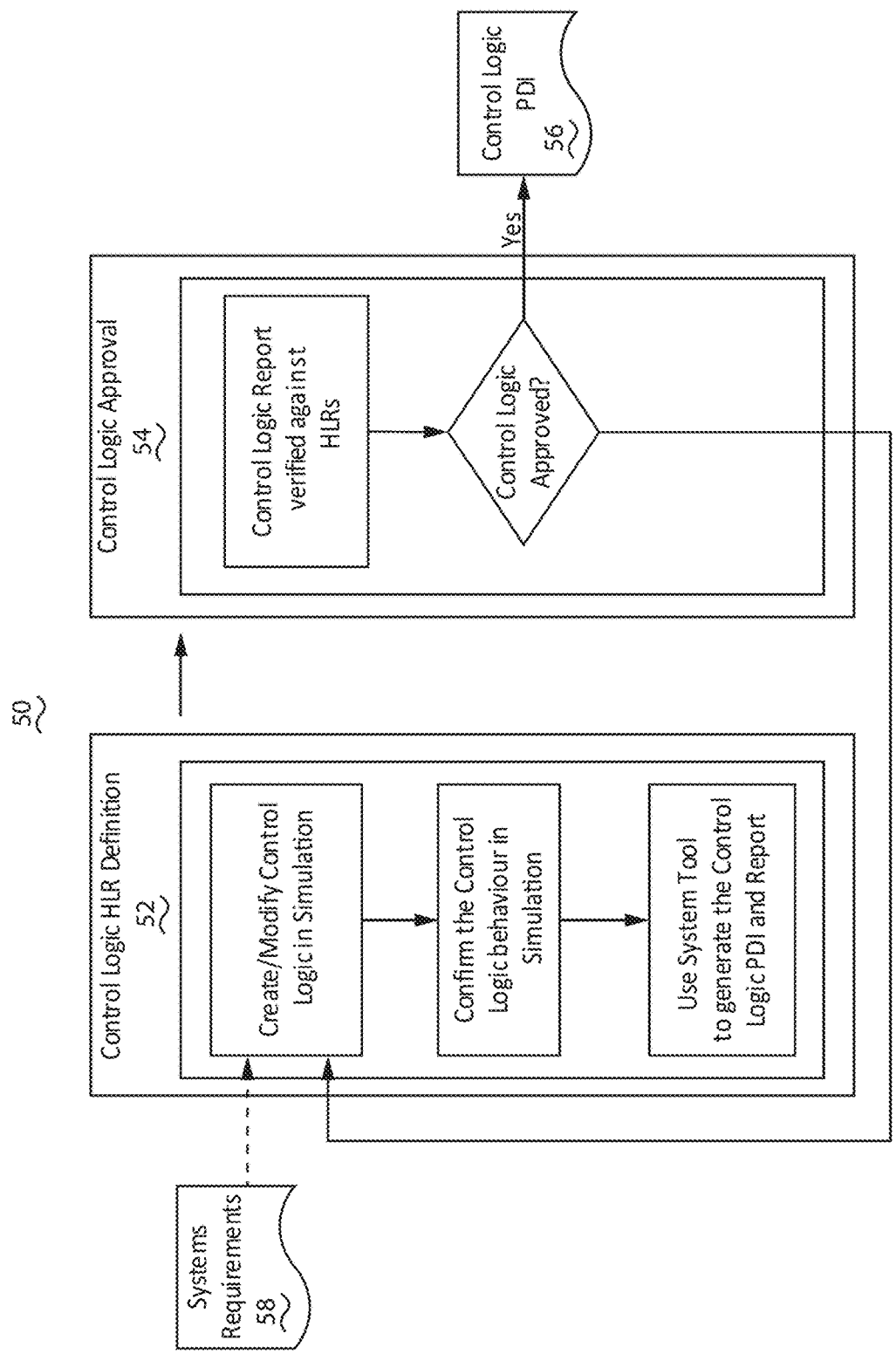
FIG. 5 is an example flow chart diagram of demonstrating a method and process of certifying the generated PDI in accordance with various aspects described herein.

As shown in FIG. 5, once these PDI modules 22, 24, 26 are generated they would be passed on to the verification tool 50, required to qualify them for application, such as avionics application. The control logic definition phase 52 represents the process defined above, with respect to FIGS. 3 and 4. The source of the logic would be from systems defined (e.g., "systems requirements" 58). The logic defined by the user itself forms the software high level requirements (for example, as per DO-178C). Once the PDI module 22, 24, 26 is generated from a chosen simulation environment 14, 16 (Simulink in this instance), it would be passed on to a verification 50. The verification tool 50 would process the PDIs 22, 24, 26 and with a combination of automated and manual verification steps 54 provide a qualified PDI 56 that could be used on the aircraft.

The PDI generation toolset or system 100 generates a PDI module and along with a PDI generates the following other artifacts to support the qualification process:

1. Images 26 of functions to act as Software High Level Requirements, and

2. XML 24 that includes data on the diagram to aid the verification process 54 (please note this XML does not contain or include any information that could be used the generate PDI on its own).

Figure 6:
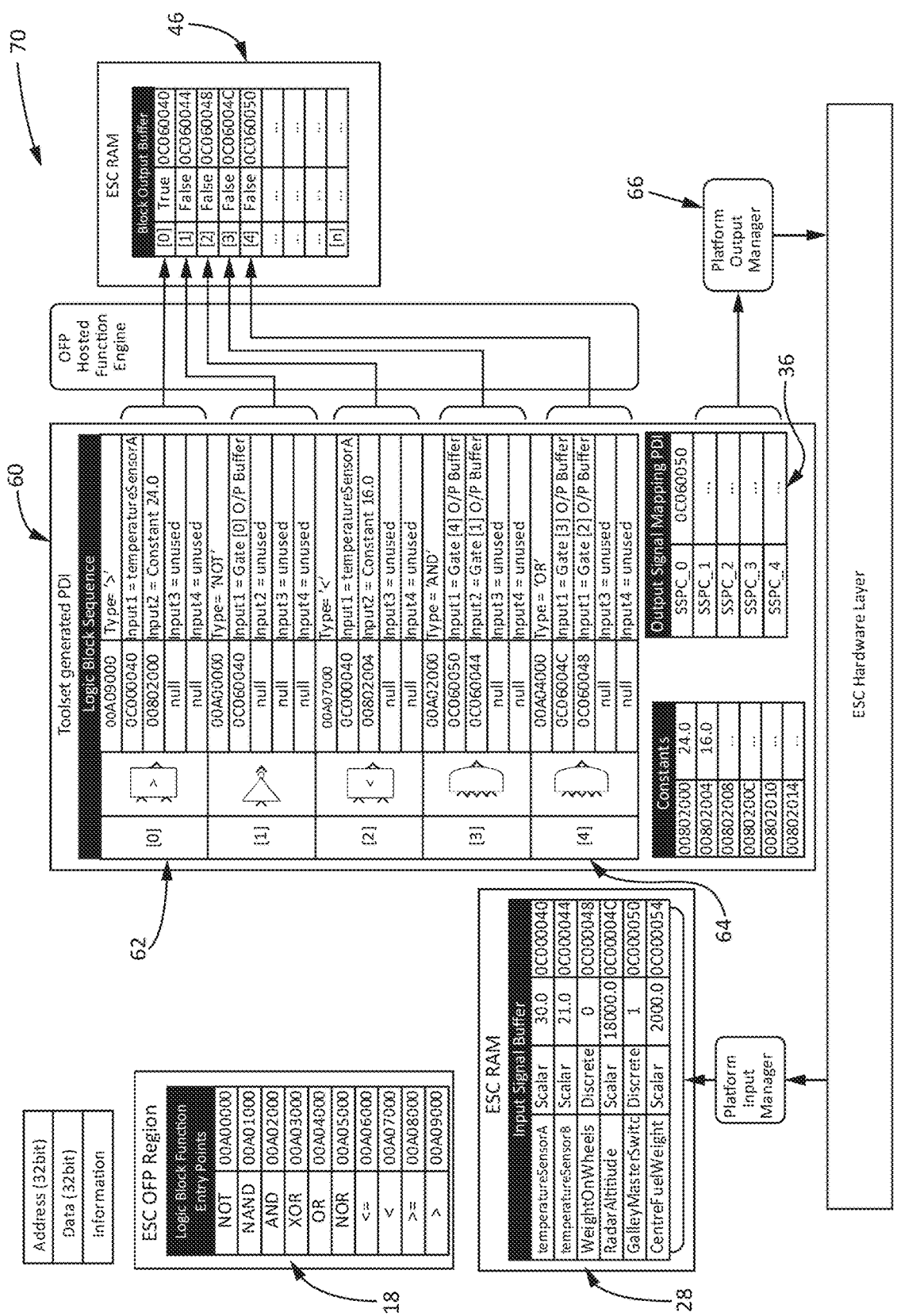
FIG. 6 illustrates an example schematic view of a detailed generated PDI of the system in accordance with various aspects described herein.

One non-limiting example of a generated PDI module 60 is shown in FIG. 6, and represented as a portion of a run-time system 70, for understanding. As shown, the logic block functions 18 can be defined or predefined in an operation flight program (OFP), and have a reference identifier (e.g. 00A00000). The system 70 can also include data received from other sources (e.g. temperature sensor AB data, radar altitude, etc., the system inputs 28, as previously described) stored in memory. The generated PDI 60 can first execute a logic block [0] (indicated by 62), defined by the 00A09000 logic block, with input 1 being the temperature sensor 00000040 data, input 2 being the constant 008002000, and inputs 3 and 4 not being utilized. The operable output of the logic block [0] can then be stored in the block output buffer memory 46 as output [0]. The logic blocks can operably execute by applying the generated PDI 60 until the effective final output (e.g. block output [4] 00060050, indicated by 64) is effected or computed, and pass the effective final output to the output signal mapping (described herein as the output PDI 36), such as to a solid-state power controller output control signal, which can further be delivered to a software-based platform output manager 66.

Figure 7:
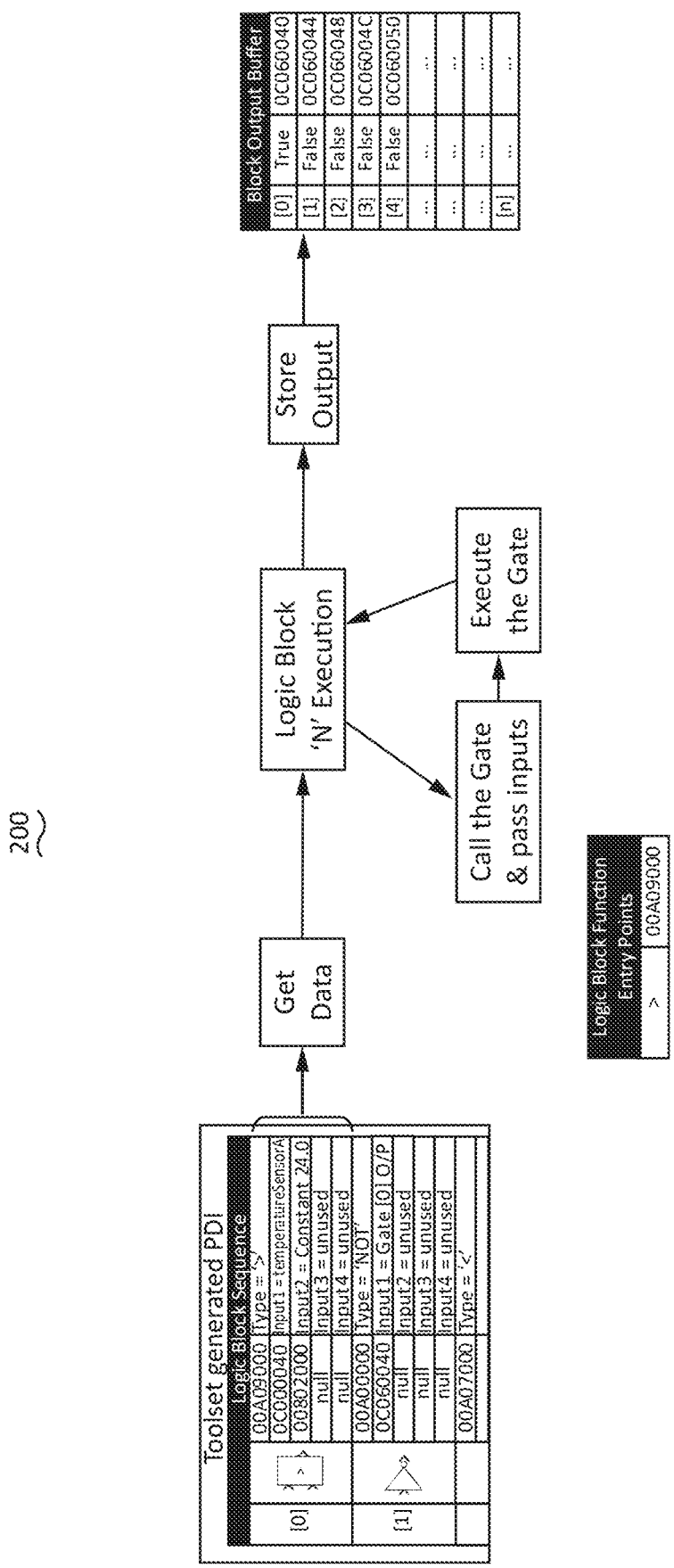
FIG. 7 illustrates an example schematic view of the logic block execution of the generated PDI of the system in accordance with various aspects described herein.

FIG. 7 illustrates another non-limiting example of the logic block execution 200 of the PDI module. While "logic block" and "logic block execution" is described herein, it is understood the actual use of the PDI is not a software or physical logic devices (e.g. circuits or the like), but rather data that can be utilized to manipulate software, such as the CDI software, or the platform output manager. In this non-limiting example, this use of PDI reduces the development and certification costs, timelines, and the like, associated with software development, and instead utilizing replacement PDI modules (generally having few development and certification costs, etc.) for modified functionality.

Figure 8:
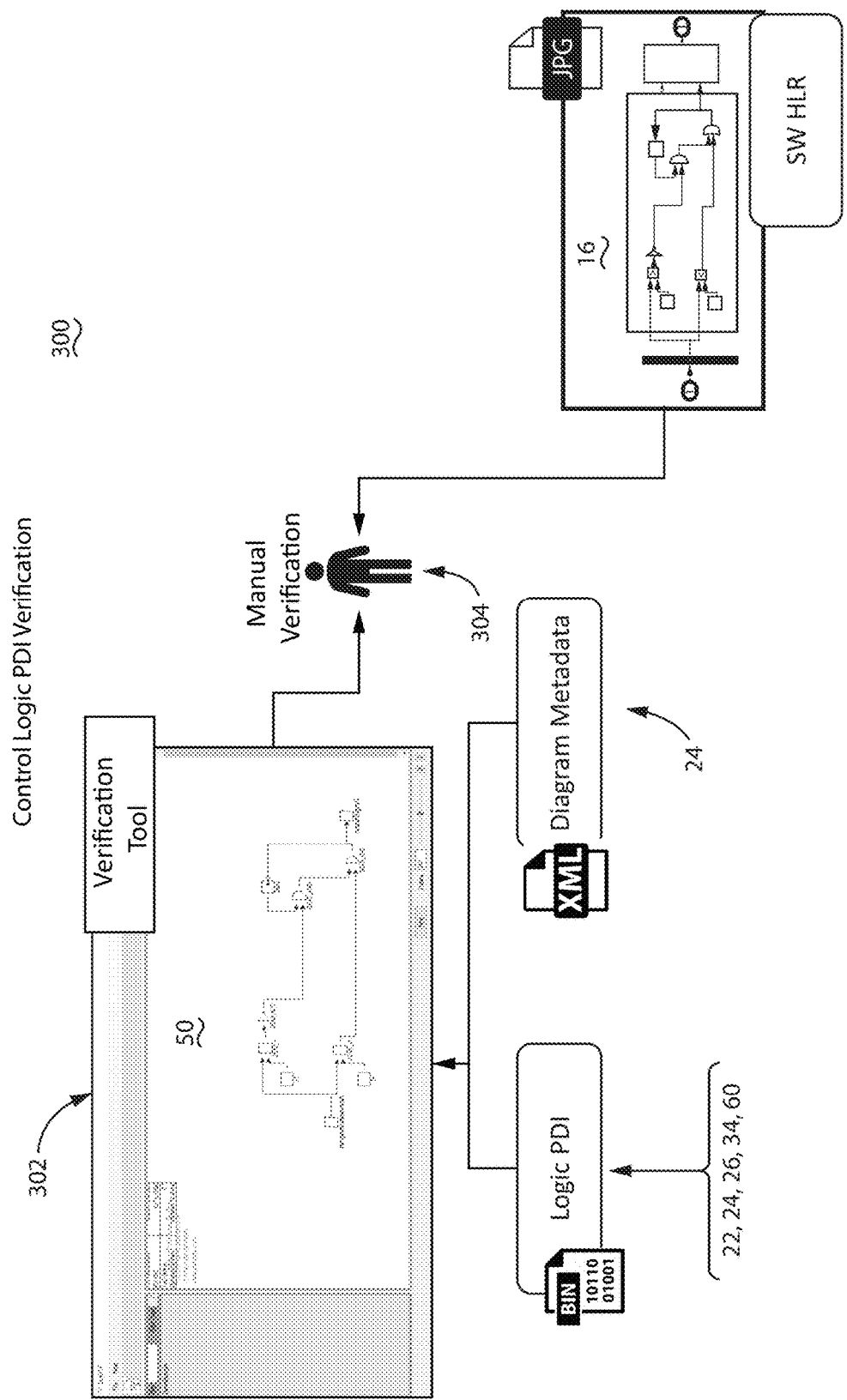
FIG. 8 illustrates an example schematic view of the control logic PDI verification process of the generated PDI of the system in accordance with various aspects described herein.

FIG. 8 illustrates the verification process 300. The PDI module 22, 24, 26, 34, 60 and the XML 24 can be received input into the verification tool 50, which performs automated checks on the validity of the PDI module 22, 24, 26, 34, 60 and along with that reverse engineers a diagrammatic representation of the function defined by the user from the PDI 22, 24, 26, 34, 60. It is configured or capable of using the XML 24 just as a drawing aid to resemble to the look in the development software 302 (e.g. Simulink or the like) to aid the user 304 to verify the PDI manually. The user 304 can, for example, compare the two diagrams to determine if they represent the same functionality. Once this verification is performed the PDI 22, 24, 26, 34, 60 is considered or certified as to be qualified as per DO-178C.

The sequence depicted is for illustrative purposes only and is not meant to limit the method or process or system in any way as it is understood that the portions of the method can proceed in a different logical order, additional or intervening portions can be included, or described portions of the method can be divided into multiple portions, or described portions of the method can be omitted without detracting from the described method.

Many other possible aspects and configurations in addition to that shown in the above figures are contemplated by the present disclosure.

The aspects disclosed herein provide a method, process, system, or the like, for developing and generating PDI modules, for use in run-time execution of a system. For example, the run-time execution can operable be controlled by way of the PDI modules to effect the outcome designed for by the PDI module, such as operating systems, subsystems, or otherwise functioning as designed. The technical effect is that the above described aspects enable the outcome designed for by the PDI module, such as operating systems, subsystems, or otherwise functioning as designed, such as operating power switches, or operating a plane system in accordance with the design or intended functions.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The features disclosed in the foregoing description, in the following claims and/or in the accompanying drawings may, both separately and in any combination thereof, be material for realizing the invention in diverse forms thereof.

What is claimed is:

1. A system for designing control logic, comprising:
a set of pre-qualified library blocks comprising data defining a respective set of available control logic operations for a desired control system;
a user interface (UI) configured for receiving an input representing a functional requirement of the desired control system and further configured for designing desired control logic and utilizing at least a subset of the pre-qualified library blocks to fulfill the functional requirement; and
a parameter data item (PDI) file generated by the system, the PDI file defining a block sequence PDI having an ordered sequence arrangement to enable the desired control logic during run-time operation in the desired control system, the PDI file including an addressable arrangement of the subset of the pre-qualified library blocks.

2. The system of claim 1, wherein the ordered sequence arrangement further defines an ordered executable arrangement of the desired control logic during run-time operation in the desired control system.

3. The system of claim 2, wherein the pre-qualified library blocks further define at least one input signal available to the desired control system and at least one output signal of the desired control system.

4. The system of claim 3, wherein the ordered sequence arrangement ensures each of the at least one input signals are processed by the desired control system during run-time prior to processing of the subset of pre-qualified library blocks.

5. The system of claim 4, wherein the ordered sequence arrangement ensures that none of the subset of pre-qualified library blocks are processed prior to all of the inputs of the respective library block being processed.

6. The system of claim 5, wherein the PDI file is recursively generated by the system to ensure the ordered sequence arrangement.

7. The system of claim 3, wherein each of the pre-qualified library blocks and each of the at least one input signals are defined by a respective address pointer, and wherein the ordered sequence arrangement defines the desired control logic by way of defining respective address pointers relative to the subset of the pre-qualified library blocks.

8. The system of claim 1, wherein the desired control system is a regulated control system of an avionics system.

9. The system of claim 8, wherein the regulated control system is a power switch.

10. The system of claim 1, wherein the set of pre-qualified library blocks includes at least a subset of logic blocks.

11. The system of claim 1, further comprising a verification tool configured to qualify the PDI file for qualified operation in the desired control system.

12. A toolset to design control logic for a power system controller in a regulated avionics system, comprising:
   a set of pre-qualified library blocks defining available control logic operations for the power system controller;
   a user interface (UI) configured for receiving an input representing a functional requirement of the regulated avionics system, and further configured for designing a desired control logic to fulfill the functional requirement, wherein the designing utilizing at least a subset of the pre-qualified library blocks;
   a parameter data item (PDI) file generated by the system, the PDI file defining a block sequence PDI having an ordered sequence arrangement to enable the desired control logic during run-time operation in the power system controller, the PDI file including an addressable arrangement of the subset of the pre-qualified library blocks; and
   a verification tool configured to qualify the PDI file for qualified operation in the power system controller of the regulated avionics system.

13. A method of designing control logic for an avionics system, the method comprising:
   receiving an input representing a functional requirement defining a desired control logic for the avionics system;
   designing, by a user in a user interface (UI) of a toolset, the desired control logic comprising selecting a subset of pre-qualified library blocks from a set of pre-qualified library blocks, and further comprising an arrangement of the subset of pre-qualified library blocks that enables the functional requirement in the avionics system, wherein the set of pre-qualified library blocks includes data defining a respective set of available control logic operations; and
   generating, by the toolset, a parameter data item (PDI) file representative of the desired control logic, wherein the PDI file includes a block sequence PDI defining an ordered sequence arrangement of operations to enable the functional requirement during run-time operation in the avionics system.

14. The method of claim 13, further comprising qualifying the generated PDI file, by a verification tool, for qualified operation in the avionics system.

15. The method of claim 13, wherein the set of pre-qualified library blocks further define at least one input signal available to the avionics system, and wherein the generating further includes that the ordered sequence arrangement ensures each of the at least one input signals are processed by the avionics system prior to processing of the subset of pre-qualified library blocks.

16. The method of claim 15, wherein the generating further includes that the ordered sequence arrangement ensures that none of the subset of pre-qualified library blocks are processed prior to all of the inputs of a respective library block of the subset of pre-qualified library blocks being processed.

17. The method of claim 16, wherein the generating includes recursively generating the PDI file.

18. The method of claim 15, wherein each of the pre-qualified library blocks and each of the at least one input signals are defined by a respective address pointer, and wherein the generating of the PDI file includes that the ordered sequence arrangement by way of defining respective address pointers relative to the subset of the pre-qualified library blocks.

* * * * *